(12) United States Patent
Kim et al.

(10) Patent No.: US 11,664,331 B2
(45) Date of Patent: May 30, 2023

(54) SEMICONDUCTOR PACKAGE

(71) Applicant: Samsung Electronics Co., Ltd., Suwon-si (KR)

(72) Inventors: Chul Woo Kim, Incheon (KR); Sang Min Yong, Cheonan-si (KR); Yang Gyoo Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/466,323

(22) Filed: Sep. 3, 2021

(65) Prior Publication Data

US 2021/0398916 A1 Dec. 23, 2021

Related U.S. Application Data

(63) Continuation of application No. 16/583,335, filed on Sep. 26, 2019, now Pat. No. 11,139,253.

(30) Foreign Application Priority Data

Mar. 26, 2019 (KR) .......................... 10-2019-0034007

(51) Int. Cl.
*H01L 23/00* (2006.01)
*H01L 25/065* (2023.01)
*H01L 23/16* (2006.01)

(52) U.S. Cl.
CPC ............ *H01L 23/562* (2013.01); *H01L 23/16* (2013.01); *H01L 25/0655* (2013.01)

(58) Field of Classification Search
CPC ... H01L 23/3675; H01L 23/562; H01L 23/16; H01L 23/367; H01L 25/0655
See application file for complete search history.

(56) References Cited

U.S. PATENT DOCUMENTS

| | | | |
|---|---|---|---|
| 6,166,434 A | 12/2000 | Desai et al. | |
| 6,472,762 B1 * | 10/2002 | Kutlu | H01L 23/3735 257/E23.101 |
| 7,585,702 B1 | 9/2009 | Wang et al. | |
| 8,642,386 B2 | 2/2014 | Lu | |
| 9,607,951 B2 | 3/2017 | Ko et al. | |
| 10,840,192 B1 * | 11/2020 | Zohni | H01L 21/4817 |
| 2006/0060963 A1 * | 3/2006 | Chang | H01L 25/0657 257/E25.011 |
| 2006/0220224 A1 | 10/2006 | Cheng | |
| 2012/0119346 A1 | 5/2012 | Im et al. | |
| 2014/0091461 A1 | 4/2014 | Shen | |
| 2015/0187679 A1 | 7/2015 | Ho et al. | |
| 2015/0333049 A1 | 11/2015 | Woychik et al. | |
| 2016/0073493 A1 | 3/2016 | Leung et al. | |
| 2017/0294401 A1 | 10/2017 | Suthiwongsunthorn et al. | |

(Continued)

*Primary Examiner* — Vongsavanh Sengdara
(74) *Attorney, Agent, or Firm* — Muir Patent Law, PLLC

(57) ABSTRACT

A semiconductor package is provided. The semiconductor package comprises a first substrate, a second substrate disposed on the first substrate, a first semiconductor chip disposed on the second substrate, and a stiffener extending from an upper surface of the first substrate to an upper surface of the second substrate, the stiffener not being in contact with the first semiconductor chip, wherein a first height from the upper surface of the first substrate to an upper surface of the first semiconductor chip is greater than a second height from the upper surface of the first substrate to an uppermost surface of the stiffener.

20 Claims, 16 Drawing Sheets

(56) References Cited

U.S. PATENT DOCUMENTS

| | | | |
|---|---|---|---|
| 2017/0372979 A1* | 12/2017 | Gandhi | H01L 23/3675 |
| 2019/0006333 A1* | 1/2019 | Ong | H01L 25/16 |
| 2019/0115269 A1* | 4/2019 | Pan | H01L 25/10 |
| 2019/0181113 A1* | 6/2019 | Morita | C09J 163/00 |
| 2020/0105642 A1* | 4/2020 | Gandhi | H01L 23/367 |

* cited by examiner

SEMICONDUCTOR PACKAGE

This application is a continuation application of U.S. patent application Ser. No. 16/583,335, filed Sep. 26, 2019, which claims priority under 35 U.S.C. § 119 to Korean Patent Application No. 10-2019-0034007 filed Mar. 26, 2019, the disclosure of each of which is incorporated herein in its entirety by reference.

BACKGROUND

1. Technical Field

The present inventive concept relates to a semiconductor package. For example, the present inventive concept relates to a shape, a structure, and a layout of a stiffener that effectively controls a warpage of a semiconductor package substrate.

2. Description of the Related Art

Along with trends of miniaturization, slimming and high density of electronic products, printed circuit boards are also being simultaneously miniaturized and slimmed together. Further, designs of the printed circuit boards become complicated due to multi-function, large-capacity of data transmission and reception and the like in addition to portability of electronic devices, and a high-level technology is required. As a result, there is an increased demand for a multilayer printed circuit board on which a power supply circuit, a ground circuit, a signal circuit and the like are formed.

Various semiconductor chips such as central processing units and power integrated circuits are mounted on a multilayer printed circuit board. High-temperature heat may be generated in the semiconductor chips during operation. If the high-temperature heat is transferred to a semiconductor chip that performs a memory function, a malfunction such as a destruction of a memory cell may be induced.

As the multilayer printed circuit boards are increasingly slimmed, a warpage may increase in the multilayer printed circuit boards. When the warpage of the multilayer printed circuit board increases, ball (e.g., solder ball) contacts may be opened to induce a malfunction in the semiconductor chips.

SUMMARY

Aspects of the present inventive concept provide a semiconductor package in which a warpage is effectively controlled.

Aspects of the present inventive concept also provide a semiconductor package in which a temperature transfer between the semiconductor chips is controlled.

According to some aspects of the present inventive concepts, a semiconductor package includes a first substrate, a second substrate disposed on the first substrate, a first semiconductor chip disposed on the second substrate, and a stiffener extending from an upper surface of the first substrate to an upper surface of the second substrate, the stiffener not being in contact with the first semiconductor chip, wherein a first height from the upper surface of the first substrate to an upper surface of the first semiconductor chip is greater than a second height from the upper surface of the first substrate to an uppermost surface of the stiffener.

According to some embodiments of the present inventive concept, a semiconductor package includes a first substrate, a second substrate disposed on the first substrate, a first semiconductor chip disposed on the second substrate, a stiffener extending from an upper surface of the first substrate to an upper surface of the second substrate, the stiffener not being in contact with the first semiconductor chip; and a first air gap between the stiffener and a sidewall of the second substrate.

According to some embodiments of the present inventive concept, a semiconductor package includes a first substrate, a second substrate disposed on the first substrate, a first semiconductor chip disposed on the second substrate, a second semiconductor chip disposed on the second substrate, the second semiconductor chip horizontally spaced apart from the first semiconductor chip, a stiffener extending from an upper surface of the first substrate to an upper surface of the second substrate, the stiffener not being in contact with either the first or second semiconductor chips, a first air gap between the stiffener and the first semiconductor chip, and a second air gap between the stiffener and the second semiconductor chip.

According to some embodiments of the present inventive concept, a semiconductor package includes a first substrate comprising a first region and a second region surrounding a periphery of the first region, a second substrate disposed on the first region, the second substrate comprising a third region and a fourth region surrounding a periphery of the third region, a first semiconductor chip disposed on the third region, a second semiconductor chip disposed on the third region, the second semiconductor chip horizontally spaced apart from the first semiconductor chip, and a stiffener extending along the second region, wherein the stiffener further extends from an upper surface of the first substrate to an upper surface of the second substrate, and the stiffener is not in contact with the first semiconductor chip and the second semiconductor chip.

According to some embodiments of the present inventive concept, a semiconductor package includes a first substrate comprising a first region and a second region surrounding a periphery of the first region, a second substrate disposed on the first region, the second substrate comprising a third region and a fourth region surrounding a periphery of the third region, a first semiconductor chip disposed on the third region, a second semiconductor chip disposed on the third region, the second semiconductor chip horizontally spaced apart from the first semiconductor chip in a first direction, a third semiconductor chip disposed on the third region, the third semiconductor chip horizontally spaced apart from the first semiconductor chip in the first direction, the third semiconductor chip horizontally spaced apart from the second semiconductor chip in a second direction, and a stiffener extending along the second region, wherein the stiffener further extends from an upper surface of the first substrate to an upper surface of the second substrate, and the stiffener further extends between the second semiconductor chip and the third semiconductor chip on the second substrate.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
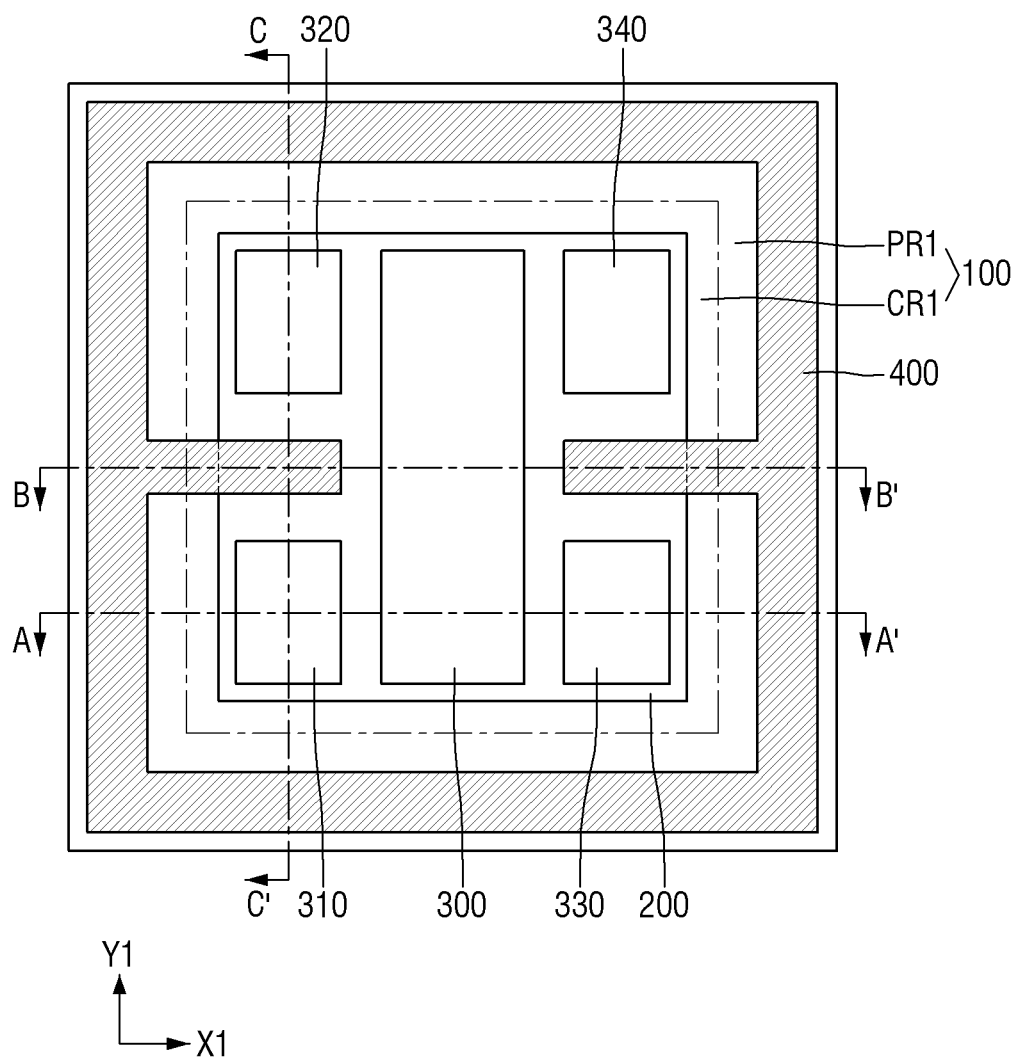
FIG. 1 is an exemplary layout diagram illustrating a semiconductor package according to some embodiments.
Figure 2:
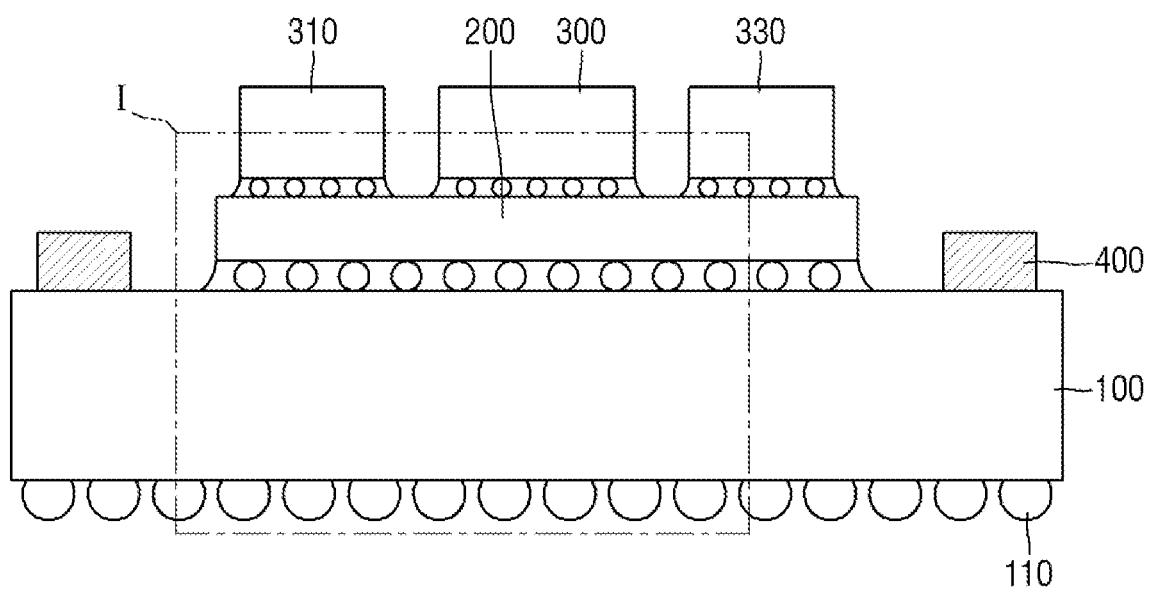
FIG. 2 is a cross-sectional view taken along a line A-A' of FIG. 1.
Figure 3:
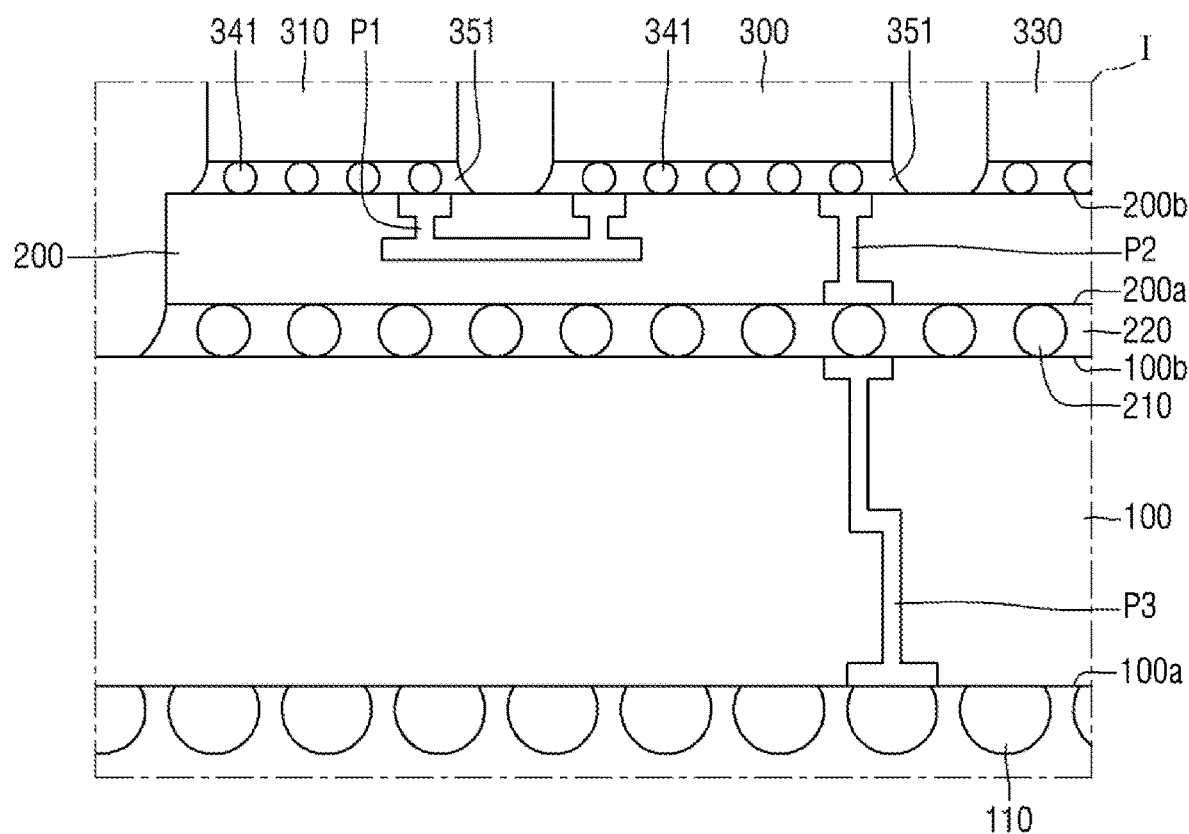
FIG. 3 is an enlarged view illustrating a region I of FIG. 2.
Figure 4:
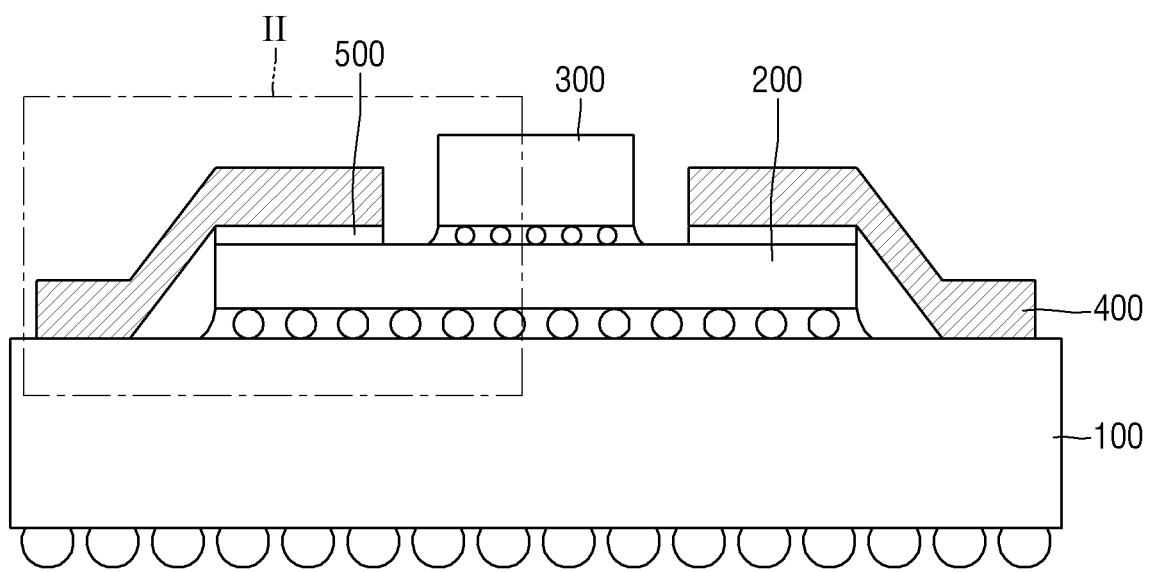
FIG. 4 is a cross-sectional view taken along a line B-B' of FIG. 1.
Figure 5:
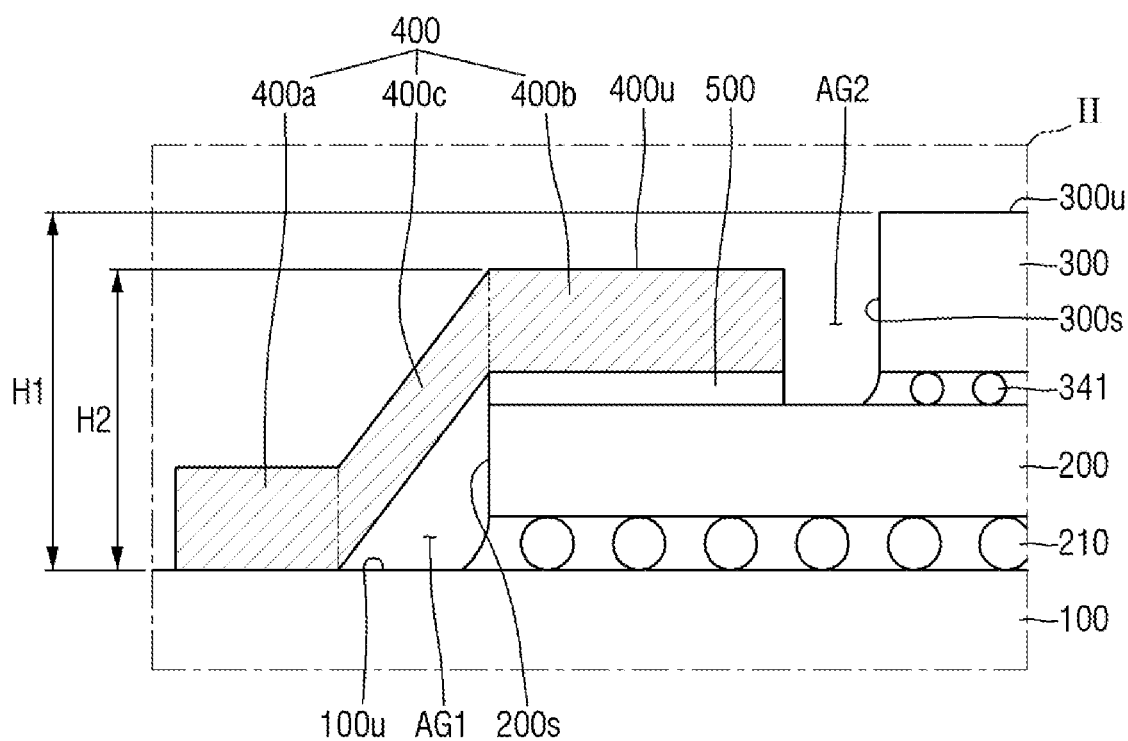
FIG. 5 is an enlarged view illustrating a region II of FIG. 4.
Figure 6:
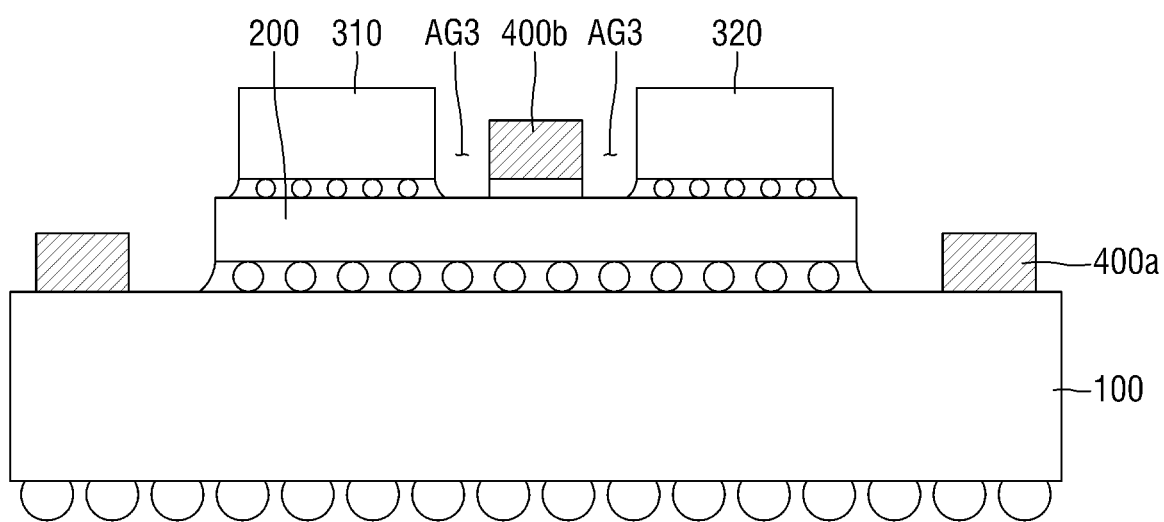
FIG. 6 is a cross-sectional view taken along a line C-C' of FIG. 1.

FIG. 1 is an exemplary layout diagram illustrating a semiconductor package according to some embodiments. FIG. 2 is a cross-sectional view taken along the line A-A' of FIG. 1. FIG. 3 is an enlarged view illustrating a region I of FIG. 2. FIG. 4 is a cross-sectional view taken along the line B-B' of FIG. 1. FIG. 5 is an enlarged view illustrating a region II of FIG. 4. FIG. 6 is a cross-sectional view taken along the line C-C' of FIG. 1.

Referring to FIG. 1, the semiconductor package according to some embodiments may include a first substrate 100, a second substrate 200, a first semiconductor chip 300, a second semiconductor chip 310, a third semiconductor chip 320, a fourth semiconductor chip 330, a fifth semiconductor chip 340, and a stiffener 400. Although the drawing illustrates that the first semiconductor chip 300 to the fifth semiconductor chip 340 are disposed on the second substrate 200, the invention is not limited to the number of semiconductor chips disposed on the second substrate 200. For example, the semiconductor package according to some embodiments may be configured as a multichip. For example, the semiconductor package according to some embodiments may include two or more semiconductor chips.

Each of the first semiconductor chip 300 to the fifth semiconductor chip 340 may be a semiconductor chip, such as a die formed from a semiconductor wafer, that performs specific functions. For example, the first semiconductor chip 300 may be a semiconductor chip that performs a logic function of a memory device. For example, the second semiconductor chip 310 to the fifth semiconductor chip 340 may be memory chips that perform a storage function of the memory device. However, the invention is not limited thereto, and the first semiconductor chip 300 to the fifth semiconductor chip 340 may perform functions different from those described above.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first semiconductor chip 300 to the fifth semiconductor chip 340 may be disposed on the second substrate 200. The first semiconductor chip 300 to the fifth semiconductor chip 340 may be spaced apart from each other on the second substrate 200. For example, on the second substrate 200, the second semiconductor chip 310 and the fourth semiconductor chip 330 may be spaced apart from each other in a first direction X1, and may be placed on both sides of the first semiconductor chip 300, respectively. Also, on the second substrate 200, the third semiconductor chip 320 and the fifth semiconductor chip 340 may be spaced apart from each other in the first direction X1, and may be disposed on both sides of the first semiconductor chip 300, respectively. For example, the second semiconductor chip 310 and the third semiconductor chip 320 may be spaced apart from each other in the second direction Y1, and may be disposed on one side of the first semiconductor chip 300. Similarly, the fourth semiconductor chip 330 and the fifth semiconductor chip 340 may be spaced apart from each other in the second direction Y1, and may be disposed on the other side of the first semiconductor chip 300. For example, the second semiconductor chip 310, the third semiconductor chip 320, the fourth semiconductor chip 330, and the fifth semiconductor chip 340 may be disposed on the second substrate 200 to be spaced apart from the first semiconductor chip 300 in the first direction X1.

The first substrate 100 may be a package substrate, for example, a printed circuit board (PCB), a ceramic substrate or the like. For example, the first substrate 100 may include a plurality of insulating films and an internal wiring layer. For example, the internal wiring layer may be disposed between two of the plurality of insulating films. The second substrate 200 may be an interposer substrate, and may include, for example, FR4, polyimide, silicon, glass or the like.

The first substrate 100 and the second substrate 200 may be connected to each other. For example, the first substrate 100 and the second substrate 200 may be electrically connected to each other with a conductor material, e.g., a solder ball or a wire. The first semiconductor chip 300 to the fifth semiconductor chip 340 may be connected to the second substrate 200. For example, the first to fifth semiconductor chips 300, 310, 320, 330 and 340 may be electrically connected to the second substrate 200 and/or may be fixed on the second substrate 200. The first semiconductor chip 300 to the fifth semiconductor chip 340 may be connected to each other through the inside of the second substrate 200. For example, the first to fifth semiconductor chips 300, 310, 320, 330 and 340 may be electrically connected to each other, e.g., through a wire formed inside the second substrate 200. Further reference is made to FIGS. 2 and 3 for an exemplary illustration.

Referring to FIGS. 1 to 3, a first connection terminal 110 may be disposed on a first surface 100a of the first substrate 100. The first connection terminal 110 may be used to electrically connect the semiconductor package according to some embodiments to an external device or a circuit. Even though the drawing illustrates that a solder ball is used as the first connection terminal 110, the invention is not limited thereto.

The second substrate 200 may be disposed on a second surface 100b of the first substrate 100. The first substrate 100 and the second substrate 200 may be electrically connected to each other through a second connection terminal 210. For example, the second connection terminal 210 may be disposed between the second surface 100b of the first substrate 100 and a first surface 200a of the second substrate 200, and may be in contact with each of the first substrate 100 and the second substrate 200. For example, the second connection terminal 210 may be directly connected to the first and second substrates 100 and 200 without any intervening layer or material. A space between the second connection terminals 210 may be filled with a first underfill material 220. The first underfill material 220 may be filled to wrap each of the second connection terminals 210 to protect the second connection terminals 210.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present (e.g., the elements are touching). Other words used to describe the relationship between elements should be interpreted in a like fashion (e.g., "between" versus "directly between," "adjacent" versus "directly adjacent," etc.).

The first semiconductor chip 300 to the fifth semiconductor chip 340 may be disposed on a second surface 200b of the second substrate 200. As described above, the first semiconductor chip 300 to the fifth semiconductor chip 340 may be spaced apart from each other. The second substrate 200 and the first semiconductor chip 300 may be electrically connected to each other through a third connection terminal 341. For example, the third connection terminal 341 may be disposed between the second surface 200b of the second substrate 200 and the first semiconductor chip 300, and may be in contact with each of the second substrate 200 and the first semiconductor chip 300. Similarly, the second substrate 200 and the second semiconductor chip 310 may be electrically connected to each other through a third connection terminal 341. For example, the third connection terminal 341 may be disposed between the second surface 200b of the second substrate 200 and the second semiconductor chip 310, and may be in contact with each of the second substrate 200 and the second semiconductor chip 310. A space between the third connection terminals 341 may be filled with a second underfill material 351. For example, the second underfill material 351 may be filled to wrap each of the third connection terminals 341 to protect the third connection terminals 341.

Similarly, each of the third semiconductor chip 320 to the fifth semiconductor chip 340 may be electrically connected to the second substrate 200 through the third connection terminals 341. For the convenience of description, a detailed description of a connection relation between the second substrate 200 and the third to fifth semiconductor chips 320 to 340 will be not be provided.

According to some embodiments, the first underfill material 220 and the second underfill material 351 may include epoxy-based resin, benzocyclobutene or polyimide. However, the invention is not limited thereto. For example, the first underfill material 220 and the second underfill material 351 may further include a silica filler. In another example, the first underfill material 220 and the second underfill material 351 may include an adhesive and a flux. The flux may include an oxide film remover. In still another example, the first underfill material 220 and the second underfill material 351 may include a silica filler or a flux. In still another example, the first underfill material 220 and the second underfill material 351 may include a non-conductive paste.

According to some embodiments, the first semiconductor chip 300 and the second semiconductor chip 310 may be electrically connected to each other via the second substrate 200. For example, the first semiconductor chip 300 and the second semiconductor chip 310 may be electrically connected to each other through a first connection path P1 formed in the second substrate 200. For example, the first connection path P1 may be a conductor pattern. For example, the third connection terminal 341 on the first semiconductor chip 300 and the third connection terminal 341 on the second semiconductor chip 310 may be electrically connected to each other through the first connection path P1 formed in the second substrate 200. The first semiconductor chip 300 and the second semiconductor chip 310 may transmit and receive electrical signals to and from each other through the first connection path P1. The shape of the first connection path P1 illustrated in FIG. 3 is simplified for convenience of the description, and the invention is not limited thereto. For example, the first connection path P1 may also have a more complex shape depending on the embodiment. Similarly, the first semiconductor chip 300 to the fifth semiconductor chip 340 may be electrically connected to each other via the second substrate 200. Similarly, the first semiconductor chip 300 to the fifth semiconductor chip 340 may transmit and receive electrical signals to and from each other. FIG. 3 illustrates only a connection relation between the first semiconductor chip 300 and the second semiconductor chip 310 for the convenience of description. Although FIG. 3 illustrates only one first connection path P1 electrically connecting between the first semiconductor chip 300 and the second semiconductor chip 310 for the convenience of explanation, the invention is not limited thereto. For example, the first semiconductor chip 300 and the second semiconductor chip 310 may be electrically connected to each other through two or more connection paths.

According to some embodiments, the first semiconductor chip 300 may be electrically connected to an external device or a circuit through the first connection terminal 110. For example, the third connection terminal 341 disposed on the first semiconductor chip 300 may be electrically connected to a second connection path P2 formed in the second substrate 200, and the second connection path P2 may be electrically connected to the second connection terminal 210. For example, the second connection path P2 may be a conductor pattern. The second connection terminal 210 may be electrically connected to the first connection terminal 110 through a third connection path P3 formed in the first substrate 100. For example, the third connection path P3 may be a conductor pattern. For example, the first semiconductor chip 300 may receive an electric power and/or electrical signals from an external device or a circuit. For example, the electric power and/or electric signals supplied to the first connection terminal 110 may be provided to the first semiconductor chip 300 through the third connection path P3, the second connection terminal 210, the second connection path P2 and the third connection terminal 341. However, this is an illustrative description, and the invention is not limited thereto. Likewise, the second semiconductor chip 310 to the fifth semiconductor chip 340 may be electrically connected to an external device or a circuit, e.g., to receive and/or transmit an electric power and/or electrical signals.

Referring to FIG. 1 again, the first substrate 100 may include a first region CR1, and a second region PR1 surrounding the first region CR1. For example, the first region CR1 may be a central region of the first substrate 100, and the second region PR1 may be a peripheral region of the first substrate 100.

According to some embodiments, the second substrate 200 may be disposed in the first region CR1 of the first substrate 100. At least a part of the stiffener 400 may be disposed in the second region PR1 of the first substrate 100. For example, at least a part of the stiffener 400 may extend along the second region PR1 of the first substrate 100. The stiffener 400 may prevent/reduce occurrence of warpage in the first substrate 100. For example, the stiffener 400 may be made of one or more material among steel, stainless steel, aluminum and copper, e.g., a thermally conductive material. Thus, the stiffener 400 may comprise a metal layer. The stiffener 400 may have a shape that includes, for example, a ring shape or a closed loop shape from a top-down view. As shown in the various figures, part of the stiffener 400 may extend diagonally at an angle with respect to the top surface of the first substrate 100. The stiffener may be a thermally conductive layer, for example, to conduct heat between two items that it connects. For example, the stiffener 400 may have one or more properties described in Table 1 below to reduce/prevent warpage of the first and/or second substrates 100/200.

TABLE 1

| Properties | Steel | Stainless steel | Aluminum | Copper |
|---|---|---|---|---|
| Density[g/cm3] | 7.75~8.05 | 7.75~8.05 | 2.7 | 8.9~9.0 |
| Elastic Modulus [GPa] | 190~210 | 190~210 | 69 | 117 |
| Thermal Expansion [$10^{-6}$/K] | 9~15 | 9~20.7 | 8.4 | 17 |
| Melting Point ['C] | 1370 | 1454 | 660 | 1083 |
| Thermal Conductivity [W/m · K] | 26~48.6 | 11.2~36.7 | 237 | 381 |
| Electrical Resistivity [$10^{-9}\Omega \cdot m$] | 210~1251 | 75.7~1020 | 27.5 | 17 |
| Tensile Strength [MPa] | 758~1882 | 515~827 | 110 | 200~400 |
| Yield Strength [MPa] | 366~1793 | 207~552 | 95 | 70 |
| Hardness [Brinell] (Kgf/mm$^2$) | 149~627 | 137~595 | 245 | 874 |

At least a part of the stiffener 400 may extend to the second substrate 200 from the first substrate 100. For example, the stiffener 400 may be disposed on the first region CR1 and the second region PR1 of the first substrate 100. For example, the stiffener 400 may extend from the first region CR1 of the first substrate 100 to a portion of the second substrate 200 between the second and third semiconductor chips 310 and 320 disposed on the second substrate 200. In certain embodiments, the stiffener 400 may extend from the first region CR1 of the first substrate 100 to a portion between the second semiconductor chip 310 and the third semiconductor chip 320 of the first substrate 100. The stiffener 400 may extend from the first region CR1 of the first substrate 100 to a portion between a fourth semiconductor chip 330 and a fifth semiconductor chip 340 of the second substrate 200. The stiffener 400 disposed on the second substrate 200 may prevent/reduce occurrence of warpage in the second substrate 200. A shape and the like of the stiffener 400 extending to the second substrate 200 from the first substrate 100 will be described further with reference to FIGS. 4 and 5.

Referring to FIGS. 1, 4 and 5, the stiffener 400 may extend to the second substrate 200 from the first substrate 100. An interface film 500 may be further disposed on the second substrate 200 between the stiffener 400 and the second substrate 200. For example, the stiffener 400 and the second substrate 200 may be connected to each other through the interface film 500.

According to some embodiments, the interface film 500 may include a combination of a silicone resin (Si resin) and a first material. The first material may include a material having a thermal conductivity of 10 W/(m·K) or more. According to some embodiments, the first material may include at least one of $Al_2O_3$, Al and ZnO. For example, the interface film 500 may include a combination of a silicone resin and $Al_2O_3$, but the invention is not limited thereto.

According to some embodiments, a first height H1 from an upper surface 100u of the first substrate 100 to an upper surface 300u of the first semiconductor chip 300 may be greater than a second height H2 from the upper surface 100u of the first substrate 100 to an uppermost surface 400u of the stiffener 400. For example, the upper surface 300u of the first semiconductor chip 300 may protrude from the uppermost surface 400u of the stiffener 400. For example, the first and second heights H1 and H2 may be distances in a direction perpendicular to the upper surface 100u of the first substrate 100.

In the semiconductor package according to some embodiments, by providing a heat sink (for example, 600 of FIG. 16) or the like on the first semiconductor chip 300 to the fifth semiconductor chip 340, heat generated from the first semiconductor chip 300 to the fifth semiconductor chip 340 may be released to the outside. If the first height H1 is smaller than the second height H2, even when the heat sink is installed, the heat generated from the first semiconductor chip 300 to the fifth semiconductor chip 340 may not be released effectively due to an interference with the stiffener 400. For example, when the first height H1 is less than the second height H2, the heat sink may not contact the semiconductor chips 300, 310, 320, 330 and 340. Therefore, according to some embodiments, by disposing the stiffener 400 such that the first height H1 is greater than the second height H2, the heat generated from the first semiconductor chip 300 to the fifth semiconductor chip 340 may be effectively released.

The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

According to some embodiments, the stiffener 400 may include a first portion 400a connected to and/or disposed on the first substrate 100, and a second portion 400b connected to and/or disposed on the second substrate 200. Further, the stiffener 400 may also include a third portion 400c which connects the first portion 400a and the second portion 400b. The third portion 400c of the stiffener 400 may not be in contact with a first sidewall 200s of the second substrate 200. For example, the first sidewall 200s of the second substrate may be exposed to the air. Also, the third portion 400c of the stiffener 400 may not be in contact with the upper surface 100u of the first substrate 100. For example, an empty space may exist between the third portion 400c of the stiffener 400, the first substrate 100 and the first sidewall 200s of the second substrate 200. For example, a first air gap AG1 may be formed/disposed between the first portion 400c of the stiffener 400, the first sidewall 200s of the second substrate 200, and the upper surface 100u of the first substrate 100. For example, the first air gap AG1 may be filled with air. In certain embodiments, the first air gap AG1 may be filled with a gas. For example, the gas may be nitrogen gas.

As mentioned above, the stiffener 400 may prevent/reduce warpage of the first substrate 100 and the second substrate 200. At this time, if the stiffener 400 comes into contact with the first sidewall 200s of the second substrate 200, a force which prevents/reduces the warpage of the first substrate 100 and the second substrate 200 may be transferred to the second substrate 200. For example, when the stiffener 400 comes into contact with the first sidewall 200s of the second substrate 200, a physical stress in a lateral direction may be transferred to the second substrate 200, e.g., from the first substrate 100 and/or the second substrate 200. In this case, by the physical stress in the lateral direction, a deformation may occur in the second substrate 200, and the connection between the first substrate 100 and the second substrate 200 may be disconnected. Thus, according to some embodiments of the present inventive concept, by forming/disposing the first air gap AG1 between the stiffener 400 and the first sidewall 200s of the second substrate 200, the physical stress transferred to the second substrate 200 can be reduced.

According to some embodiments, the stiffener 400 is not in contact with a second sidewall 300s of the first semiconductor chip 300. For example, the second sidewall 300s of the first semiconductor chip 300 may be exposed to the air. For example, an empty space may exist between the first semiconductor chip 300 and the stiffener 400. For example, a second air gap AG2 may be formed/disposed between the second portion 400b of the stiffener 400 and the second sidewall 300s of the first semiconductor chip 300. For example, the second air gap AG2 may be filled with air or a gas, e.g., nitrogen gas. Additional explanation will be made below with reference to FIG. 6.

According to some embodiments, the stiffener 400 is not in contact with the second semiconductor chip 310. For example, an empty space may exist between the second portion 400b of the stiffener 400 and the second semiconductor chip 310. Also, the stiffener 400 may not be in contact with the third semiconductor chip 320. For example, an empty space may exist between the second portion 400b of the stiffener 400 and the third semiconductor chip 320. For example, a third air gap AG3 may be formed/disposed between the stiffener 400 and the second semiconductor chip 310, and between the stiffener 400 and the third semiconductor chip 320. For example, the third air gap AG3 may be filled with air or a gas, e.g., nitrogen gas.

For convenience of explanation, the first semiconductor chip 300 is assumed to be a logic chip of a memory device, and the second semiconductor chip 310 and the third semiconductor chip 320 are assumed to be memory chips of the memory device. For example, each chip described herein may be a single chip or a stack of chips. As mentioned above, the stiffener 400 and the first semiconductor chip 300 may not be in contact with each other. For example, the second air gap AG2 may be formed/disposed between the stiffener 400 and the first semiconductor chip 300. The stiffener 400 and the second semiconductor chip 310 may not be in contact with each other. The stiffener 400 and the third semiconductor chip 320 may not be in contact with each other. For example, the third air gap AG3 may be formed/disposed between the stiffener 400 and the second semiconductor chip 310, and between the stiffener 400 and the third semiconductor chip 320.

When the semiconductor package according to some embodiments operates, the first semiconductor chip 300 may generate more heat than the second semiconductor chip 310 and the third semiconductor chip 320. If the stiffener 400 were arranged to come into contact with the first semiconductor chip 300, the second semiconductor chip 310 and the third semiconductor chip 320, e.g., the second air gap AG2 and/or the third air gap AG3 were not formed/disposed between the stiffener 400, and the first semiconductor chip 300, the second semiconductor chip 310 and the third semiconductor chip 320, the heat generated from the first semiconductor chip 300 may be transferred to the second semiconductor chip 310 and the third semiconductor chip 320. Since the memory chips are vulnerable to heat, the second semiconductor chip 310 and the third semiconductor chip 320 may malfunction or memory cells may be destroyed. Thus, by forming/disposing the second air gap AG2 and/or the third air gap AG3 between the semiconductor stiffener 400 according to some embodiments, and the first semiconductor chip 300, the second semiconductor chip 310 and the third semiconductor chip 320, it is possible to prevent the heat from being transferred to the semiconductor chips which are vulnerable to a high temperature. Furthermore, by forming/disposing the second air gap AG2 and/or the third air gap AG3 between the semiconductor stiffener 400 according to some embodiments, and the first semiconductor chip 300, the second semiconductor chip 310 and the third semiconductor chip 320, it is possible to prevent/reduce the malfunction of the semiconductor package according to some embodiments.

Similarly, each of the fourth semiconductor chip 330 and the fifth semiconductor chip 340 may not be in contact with the stiffener 400. For example, an air gap may be formed/disposed between the stiffener 400 and the fourth semiconductor chip 330, and between the stiffener 400 and the fifth semiconductor chip 340.

Figure 7:
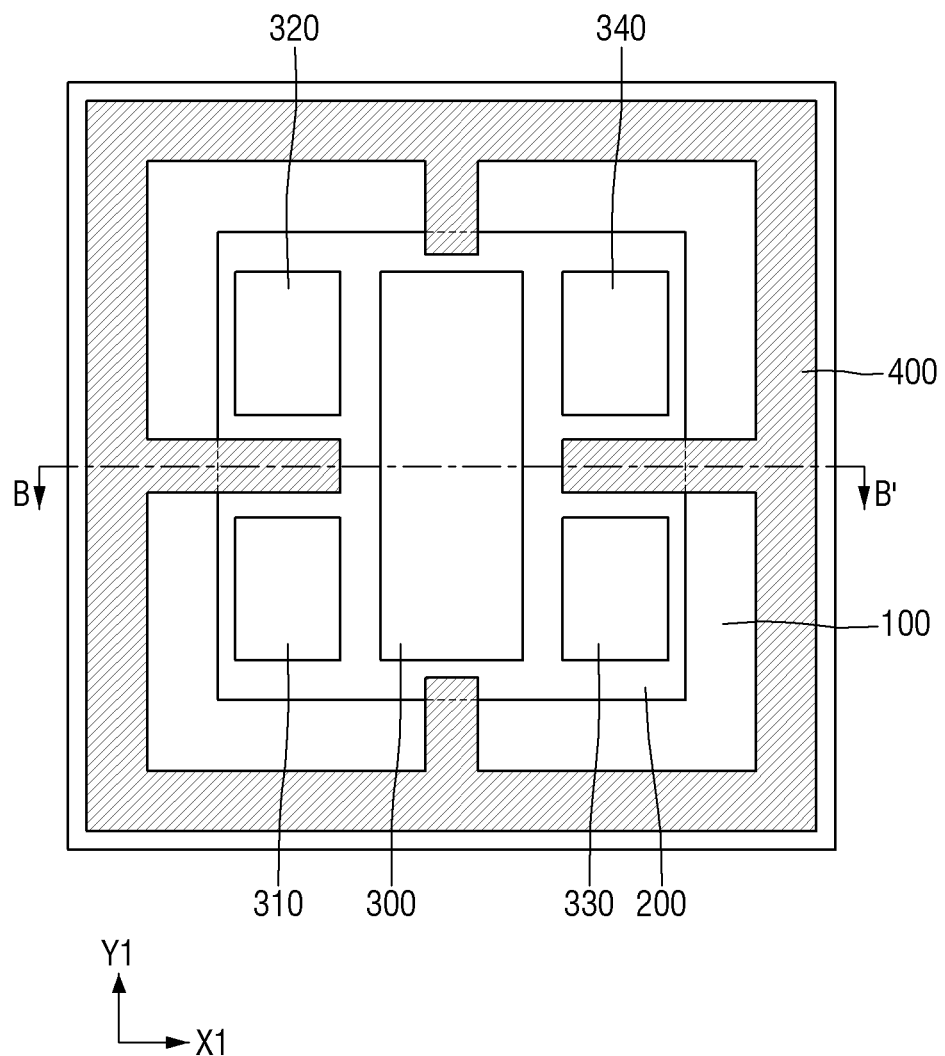
FIG. 7 is an exemplary layout diagram illustrating a semiconductor package according to some embodiments.

FIG. 7 is an exemplary layout diagram for explaining a semiconductor package according to some embodiments. For convenience of explanation, repeated or similar contents will be omitted or briefly described.

Referring to FIG. 7, the semiconductor package according to some embodiments may include a first substrate 100, a second substrate 200, a first semiconductor chip 300 to a fifth semiconductor chip 340, and a stiffener 400. The second substrate 200 may be disposed on the first substrate 100. The first semiconductor chip 300 to the fifth semiconductor chip 340 may be disposed on the second substrate 200.

The stiffener 400 according to some embodiments may further extend to the second substrate 200 from the first substrate 100 along a second direction Y1, e.g., to be formed on the first substrate 100 and the second substrate 200. The second direction Y1 may be perpendicular to the first direction X1. The stiffener 400 may not be in contact with the first semiconductor chip 300 to the fifth semiconductor chip 340 on the second substrate 200. For example, air gaps may be formed/disposed between the stiffener 400 and the first semiconductor chip 300 to the fifth semiconductor chip 340. Also, as described above, an air gap may also be formed/disposed between the stiffener 400 and the first sidewall 200s of the second substrate 200. The air gaps may be filled with air or a gas, e.g., nitrogen gas. A cross-sectional view taken along the line B-B' of FIG. 7 may be similar to that of FIG. 4. Therefore, explanations thereof will not be provided.

Figure 8:
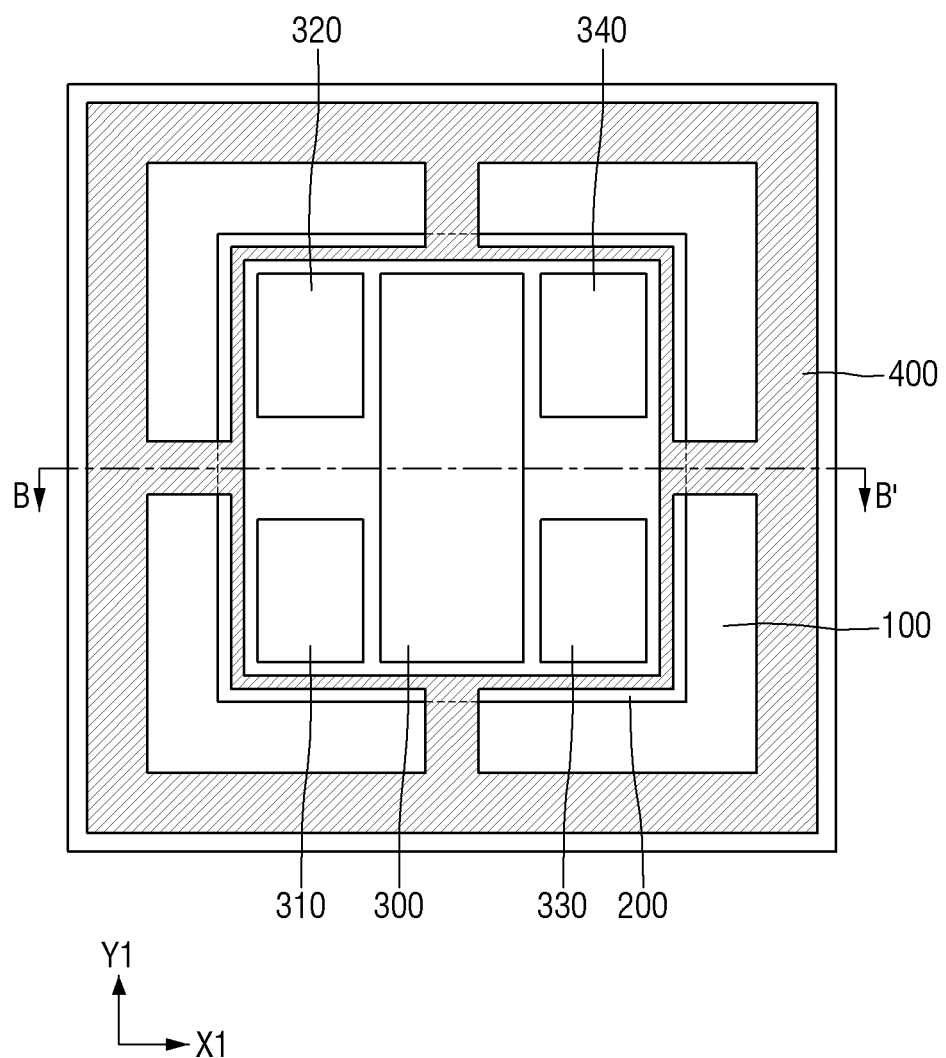
FIG. 8 is an exemplary layout diagram illustrating a semiconductor package according to some embodiments.

FIG. 8 is an exemplary layout diagram illustrating a semiconductor package according to some embodiments. For convenience of explanation, repeated or similar contents will be omitted or briefly described.

Referring to FIG. 8, the semiconductor package according to some embodiments may include a first substrate 100, a second substrate 200, a first semiconductor chip 300 to a fifth semiconductor chip 340, and a stiffener 400. The second substrate 200 may be disposed on the first substrate 100. The first semiconductor chip 300 to the fifth semiconductor chip 340 may be disposed on the second substrate 200.

The stiffener 400 according to some embodiments may further extend to surround the peripheries of the first semiconductor chip 300 to the fifth semiconductor chip 340 on the second substrate 200. For example, the stiffener 400 may further extend in the first direction X1 and the second direction Y1 on the second substrate 200, e.g., along edges of the second substrate 200.

The stiffener 400 may not be in contact with the first semiconductor chip 300 to the fifth semiconductor chip 340 on the second substrate 200. For example, air gaps may be formed/disposed between the stiffener 400 and the first semiconductor chip 300 to the fifth semiconductor chip 340, respectively. Also, as described above, an air gap may also be formed/disposed between the stiffener 400 and the first sidewall 200s of the second substrate 200. A cross-sectional view taken along the line B-B' of FIG. 8 may be similar to FIG. 4. Therefore, explanations thereof will not be provided.

Figure 9:
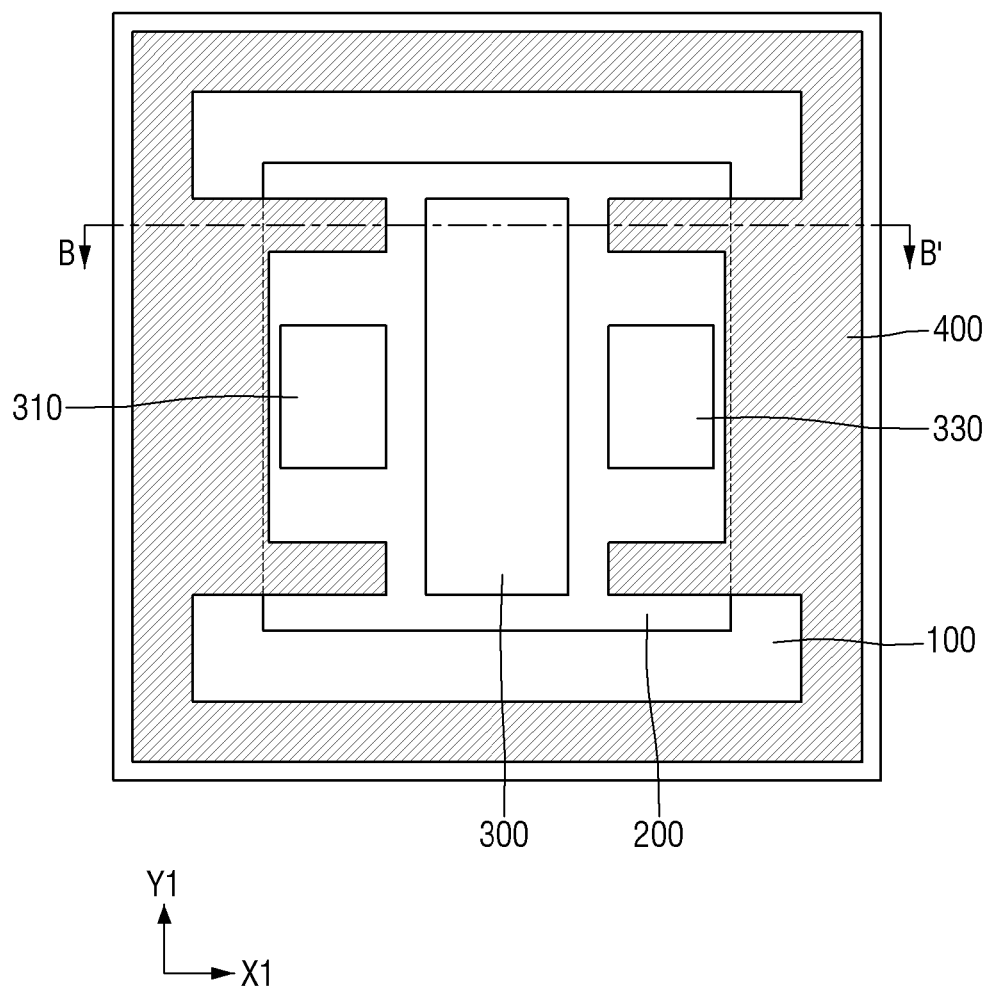
FIG. 9 is an exemplary layout diagram illustrating a semiconductor package according to some embodiments.

FIG. 9 is an exemplary layout diagram illustrating a semiconductor package according to some embodiments. For convenience of explanation, repeated or similar contents will be omitted or briefly described.

Referring to FIG. 9, the semiconductor package according to some embodiments may include a first substrate 100, a second substrate 200, a first semiconductor chip 300, a second semiconductor chip 310, a fourth semiconductor chip 330 and a stiffener 400. The second substrate 200 may be disposed on the first substrate 100. The first semiconductor chip 300, the second semiconductor chip 310 and the fourth semiconductor chip 330 may be disposed on the second substrate 200.

The stiffener 400 according to some embodiments may further extend to surround three sides of the second semiconductor chip 310 on the second substrate 200. Similarly, the stiffener 400 may further extend to surround three sides of the fourth semiconductor chip 330 on the second substrate 200.

The stiffener 400 may not come into contact with the first semiconductor chip 300, the second semiconductor chip 310 and the fourth semiconductor chip 330 on the second substrate 200. For example, air gaps may be formed/disposed between the stiffener 400 and the first semiconductor chip 300, between the stiffener 400 and the second semiconductor chip 310, and between the stiffener 400 and the fourth semiconductor chips 330, respectively. Also, as described above, an air gap may also be formed/disposed between the stiffener 400 and the first sidewall 200s of the second substrate 200. A cross-sectional view taken along the line B-B' of FIG. 9 may be similar to FIG. 4. Therefore, explanations thereof will not be provided.

Figure 10:
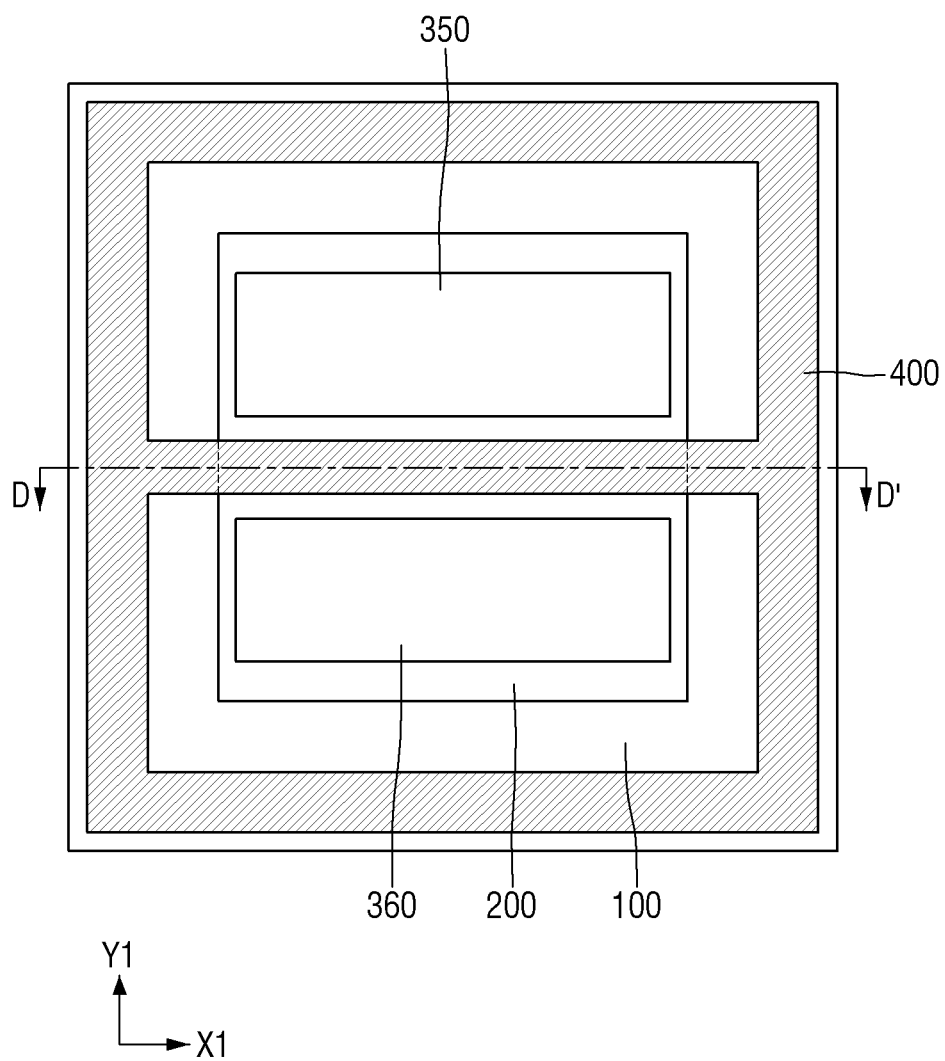
FIG. 10 is an exemplary layout diagram illustrating a semiconductor package according to some embodiments.
Figure 11:
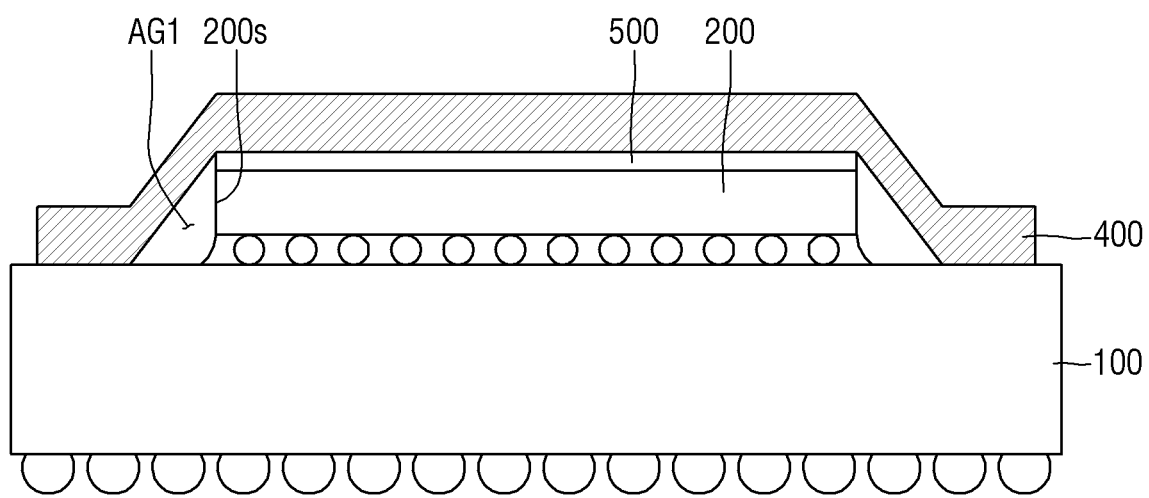
FIG. 11 is a cross-sectional view taken along a line D-D' of FIG. 10.

FIG. 10 is an exemplary layout diagram illustrating a semiconductor package according to some embodiments. FIG. 11 is a cross-sectional view taken along the line D-D' of FIG. 10. For convenience of explanation, repeated or similar contents will be omitted or briefly described.

Referring to FIGS. 10 and 11, the semiconductor package according to some embodiments may include a first substrate 100, a second substrate 200, a sixth semiconductor chip 350, a seventh semiconductor chip 360 and a stiffener 400. The sixth semiconductor chip 350 and the seventh semiconductor chip 360 may be disposed on the second substrate 200. The sixth semiconductor chip 350 and the seventh semiconductor chip 360 may be spaced apart from each other in the second direction Y1 on the second substrate 200.

The stiffener 400 according to some embodiments may extend along a gap formed between the sixth semiconductor chip 350 and the seventh semiconductor chip 360 on the second substrate 200. For example, the stiffener 400 may extend to the second substrate 200 from the first substrate 100 between the sixth semiconductor chip 350 and the seventh semiconductor chip 360. For example, the stiffener 400 may cross the second substrate 200 and be formed on the second substrate 200.

The stiffener 400 may not be in contact with the sixth semiconductor chip 350 and the seventh semiconductor chip 360. For example, air gaps may be formed/disposed between the stiffener 400 and the sixth semiconductor chip 350, and between the stiffener 400 and the seventh semiconductor chip 360, respectively. Also, as illustrated in FIG. 11, a first air gap AG1 may be formed/disposed between the stiffener 400 and the first sidewall 200s of the second substrate 200. For example, an empty space may exist between the stiffener 400 and the first sidewall 200s of the second substrate 200.

Figure 12:
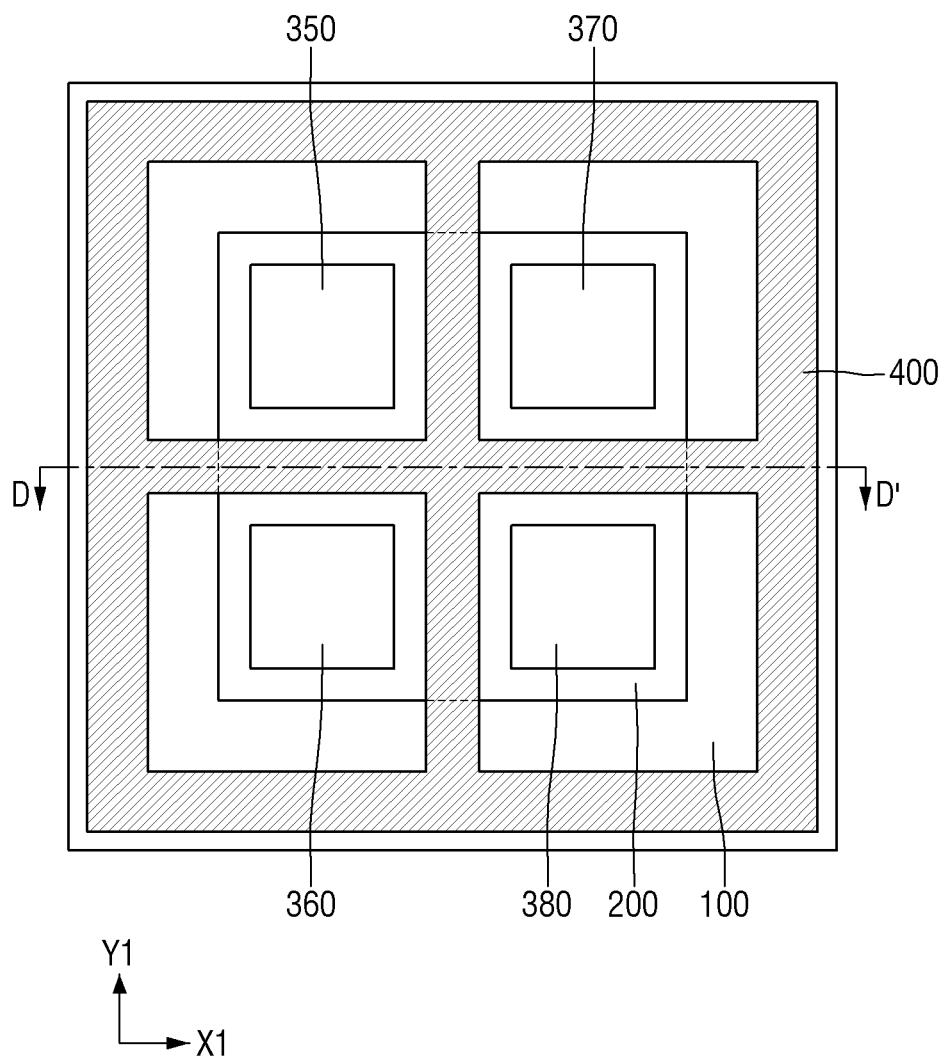
FIG. 12 is an exemplary layout diagram illustrating a semiconductor package according to some embodiments.

FIG. 12 is an exemplary layout diagram illustrating a semiconductor package according to some embodiments. For convenience of explanation, repeated or similar contents will be omitted or briefly described.

Referring to FIG. 12, the semiconductor package according to some embodiments may include a first substrate 100, a second substrate 200, a sixth semiconductor chip 350, a seventh semiconductor chip 360, an eighth semiconductor chip 370, a ninth semiconductor chip 380 and a stiffener 400. The sixth ninth semiconductor chip 350 to the ninth semiconductor chip 380 may be disposed on the second substrate 200. The sixth semiconductor chip 350 and the seventh semiconductor chip 360 may be spaced apart from each other in the second direction Y1 on the second substrate 200. The eighth semiconductor chip 370 and the ninth semiconductor chip 380 may be spaced apart from each other in the second direction Y1 on the second substrate 200. The sixth semiconductor chip 350 and the eighth semiconductor chip 370 may be spaced apart from each other in the first direction X1 on the second substrate 200. The seventh semiconductor chip 360 and the ninth semiconductor chip 380 may be spaced apart from each other in the first direction X1 on the second substrate 200.

The stiffener 400 according to some embodiments may extend in the first direction X1 on the second substrate 200 to cross between the sixth semiconductor chip 350 and the seventh semiconductor chip 360, and between the eighth semiconductor chip 370 and the ninth semiconductor chip 380. In addition, the stiffener 400 may further extend in the second direction Y1 to cross between the sixth semiconductor chip 350 and the eighth semiconductor chip 370, and between the seventh semiconductor chip 360 and the ninth semiconductor chip 380. For example, the stiffener 400 may cross the second substrate 200 in the first and second directions X1 and Y1 and be formed on the second substrate 200.

The stiffener 400 and the sixth semiconductor chip 350 to the ninth semiconductor chip 380 may not be in contact with each other on the second substrate 200. For example, air gaps may be formed/disposed between the stiffener 400 and the sixth semiconductor chip 350, between the stiffener 400 and the seventh semiconductor chip 360, between the stiffener 400 and the eighth semiconductor chip 370, and between the stiffener 400 and the ninth semiconductor chip 380, respectively. Also, as described above, an air gap may also be formed/disposed between the stiffener 400 and the first sidewall 200s of the second substrate 200. A cross-sectional view taken along the line D-D' of FIG. 12 may be similar to FIG. 11. Therefore, explanations thereof will not be provided.

Figure 13:
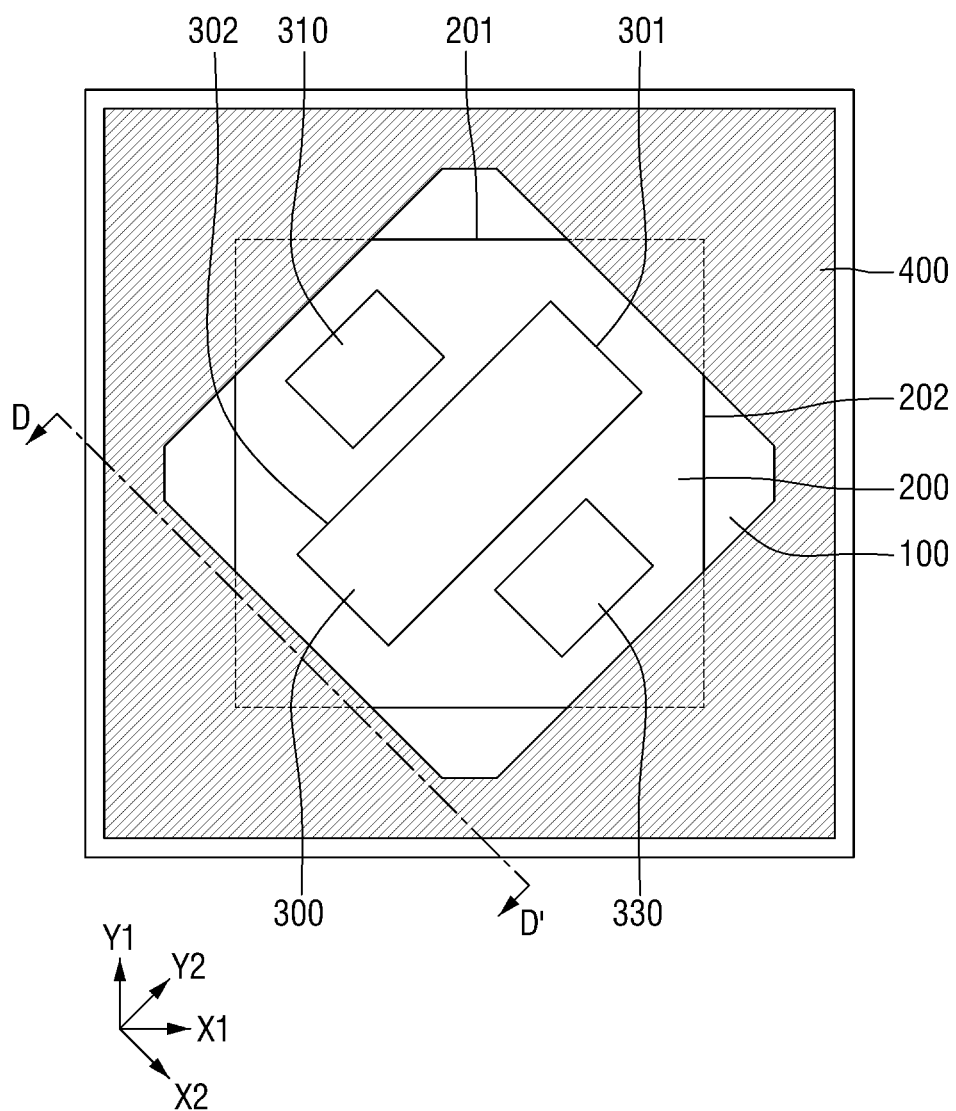
FIG. 13 is an exemplary layout diagram illustrating a semiconductor package according to some embodiments.

FIG. 13 is an exemplary layout diagram illustrating a semiconductor package according to some embodiments. For convenience of explanation, repeated or similar contents will be omitted or briefly described.

Referring to FIG. 13, the semiconductor package according to some embodiments may include a first substrate 100, a second substrate 200, a first semiconductor chip 300, a second semiconductor chip 310, a fourth semiconductor chip 330 and a stiffener 400. The first semiconductor chip 300, the second semiconductor chip 310, and the fourth semiconductor chip 330 may be disposed on the second substrate 200.

According to some embodiments, the second substrate 200 may include a first side 201 extending in the first direction X1, and a second side 202 extending in the second direction Y1. The first semiconductor chip 300 may include a third side 301 extending in the third direction X2, and a fourth side 302 extending in the fourth direction Y2. The first direction X1 to the fourth direction Y2 may be different from one another. For example, the first to fourth directions X1, Y1, X2 and Y2 may be in the same plane. For example, the third direction X2 and the fourth direction Y2 may be perpendicular to each other. For example, the first semiconductor chip 300 may be disposed on the second substrate 200 obliquely to the second substrate 200, e.g., in a plan view. Similarly, each of the second semiconductor chip 310 and the fourth semiconductor chip 330 may be disposed on the second substrate 200 obliquely to the second substrate 200. For example, edge lines of the semiconductor chips 300, 310 and 330 may neither parallel nor perpendicular to edge lines of the second substrate 200 in a plan view.

The stiffener 400 according to some embodiments may extend to pass the corners of the second substrate 200. For example, the stiffener 400 may extend to the second substrate 200 from the first substrate 100 along the third direction X2. In another example, the stiffener 400 may extend to the second substrate 200 from the first substrate 100 along the fourth direction Y2. For example, edge lines of the stiffener 400 formed on the second substrate 200 may be parallel to the third and fourth directions X2 and Y2 respectively.

The stiffener 400 may not be in contact with the first semiconductor chip 300, the second semiconductor chip 310 and the fourth semiconductor chip 330 on the second substrate 200. For example, air gaps may be formed/disposed between the stiffener 400 and the first semiconductor chip 300, between the stiffener 400 and the second semiconductor chip 310, and between the stiffener 400 and the fourth semiconductor chip 330, respectively. Also, as described above, an air gap may also be formed/disposed between the stiffener 400 and the first sidewall 200s of the second substrate 200. A cross-sectional view taken along the line D-D' of FIG. 13 may be similar to FIG. 11. Therefore, explanations thereof will not be provided.

Figure 14:
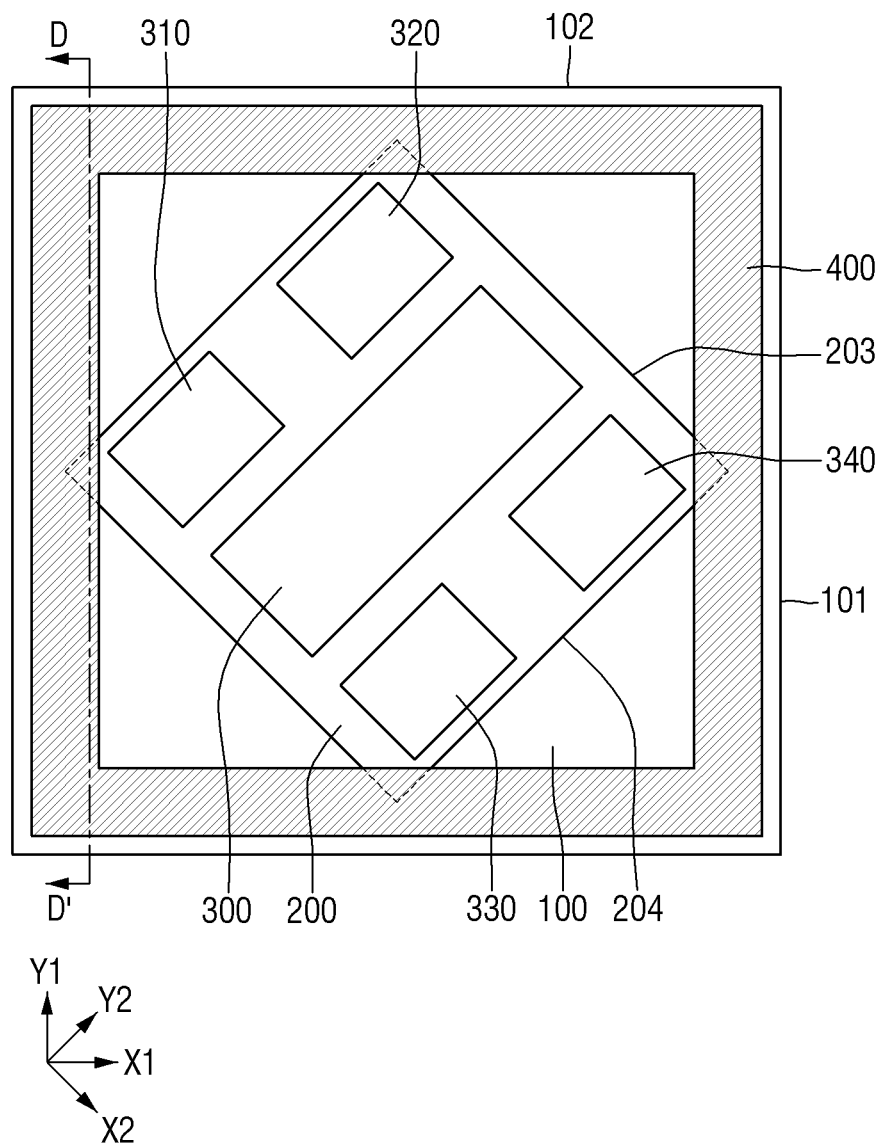
FIG. 14 is an exemplary layout diagram illustrating a semiconductor package according to some embodiments.

FIG. 14 is an exemplary layout diagram illustrating a semiconductor package according to some embodiments. For convenience of explanation, repeated or similar contents will be omitted or briefly described.

Referring to FIG. 14, the semiconductor package according to some embodiments may include a first substrate 100, a second substrate 200, a first semiconductor chip 300 to a fifth semiconductor chip 340, and a stiffener 400. The first semiconductor chip 300 to the fifth semiconductor chip 340 may be disposed on the second substrate 200.

According to some embodiments, the first substrate 100 may include a fifth side 101 extending in the second direction Y1, and a sixth side 102 extending in the first direction X1. The second substrate 200 may include a seventh side 203 extending in the third direction X2, and an eighth side 204 extending in the fourth direction Y2. The first direction X1 to the fourth direction Y2 may be different from one another. For example, the second substrate 200 may be disposed on the first substrate 100 obliquely to the first substrate 100. For example, edge lines of the second substrate 200 may neither parallel nor perpendicular to edge lines of the first substrate 100 in a plan view. Although FIG. 14 illustrates that the first semiconductor chip 300 to the fifth semiconductor chip 340 are disposed side by side with the second substrate 200, e.g., adjacent sides of the second substrate 200 and the chips 300, 310, 320, 330 and 340 are parallel with each other in FIG. 14, the invention is not limited thereto.

According to some embodiments, the stiffener 400 may extend to at least one corner of the second substrate 200. For example, the stiffener 400 may extend to the second substrate 200 from the first substrate 100 along the first direction X1. In another example, the stiffener 400 may extend to the second substrate 200 from the first substrate 100 along the second direction Y1, e.g., for the stiffener 400 to be formed on corners of the second substrate 200.

The stiffener 400 may not be in contact with the first semiconductor chip 300 to the fifth semiconductor chip 340 on the second substrate 200. For example, air gaps may be formed/disposed between the stiffener 400 and the first semiconductor chip 300, between the stiffener 400 and the second semiconductor chip 310, between the stiffener 400 and the third semiconductor chip 320, between the stiffener 400 and the fourth semiconductor chip 330, and between the stiffener 400 and the fifth semiconductor chip 340, respectively. Also, as described above, an air gap may also be formed/disposed between the stiffener 400 and the first sidewall 200s of the second substrate 200. A cross-sectional view taken along the line D-D' of FIG. 14 may be similar to FIG. 11. Therefore, explanations thereof will not be provided.

Figure 15:
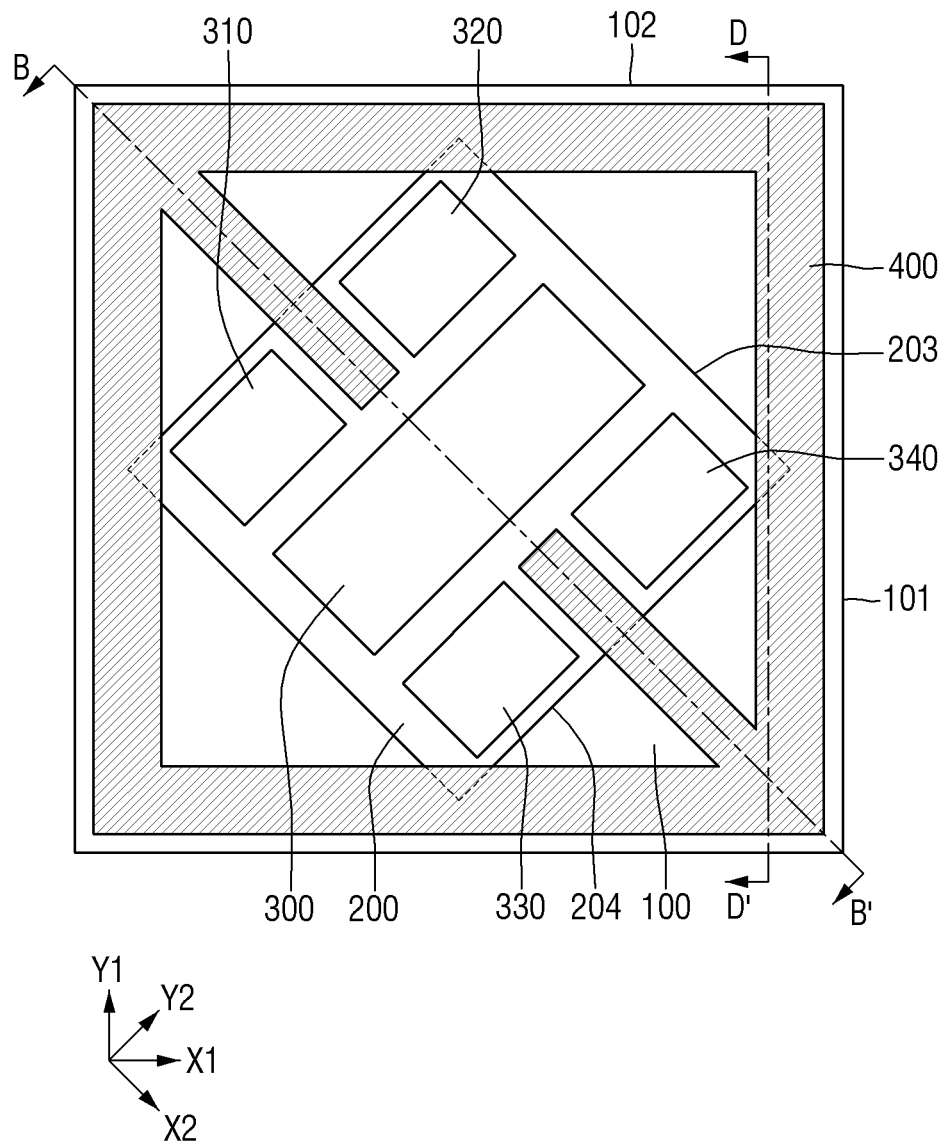
FIG. 15 is an exemplary layout diagram illustrating a semiconductor package according to some embodiments.

FIG. 15 is an exemplary layout diagram illustrating a semiconductor package according to some embodiments. For convenience of explanation, repeated or similar contents will be omitted or briefly described.

The stiffener 400 of the semiconductor package described using FIG. 14 may further extend in the third direction X2. The stiffener 400 may further extend to the second substrate 200 from the first substrate 100 along the third direction X2. For example, the stiffener 400 may further extend along the third direction X2 between the second semiconductor chip 310 and the third semiconductor chip 320, e.g., to be formed on the second substrate 200. For example, the stiffener 400 may further extend along the third direction X2 between the fourth semiconductor chip 330 and the fifth semiconductor chip 340, e.g., to be formed on the second substrate 200.

The stiffener 400 may not be in contact with the first semiconductor chip 300 to the fifth semiconductor chip 340 on the second substrate 200. For example, air gaps may be formed/disposed between the stiffener 400 and the first semiconductor chip 300, between the stiffener 400 and the second semiconductor chip 310, between the stiffener 400 and the third semiconductor chip 320, between the stiffener 400 and the fourth semiconductor chip 330, and between the stiffener 400 and the fifth semiconductor chip 340, respectively. Also, as described above, an air gap may also be formed/disposed between the stiffener 400 and the first sidewall 200s of the second substrate 200. Since a cross-sectional view taken along the line D-D' of FIG. 15 may be similar to FIG. 11, and a cross-sectional view taken along the line B-B' may be similar to FIG. 4, descriptions thereof will not be provided.

Figure 16:
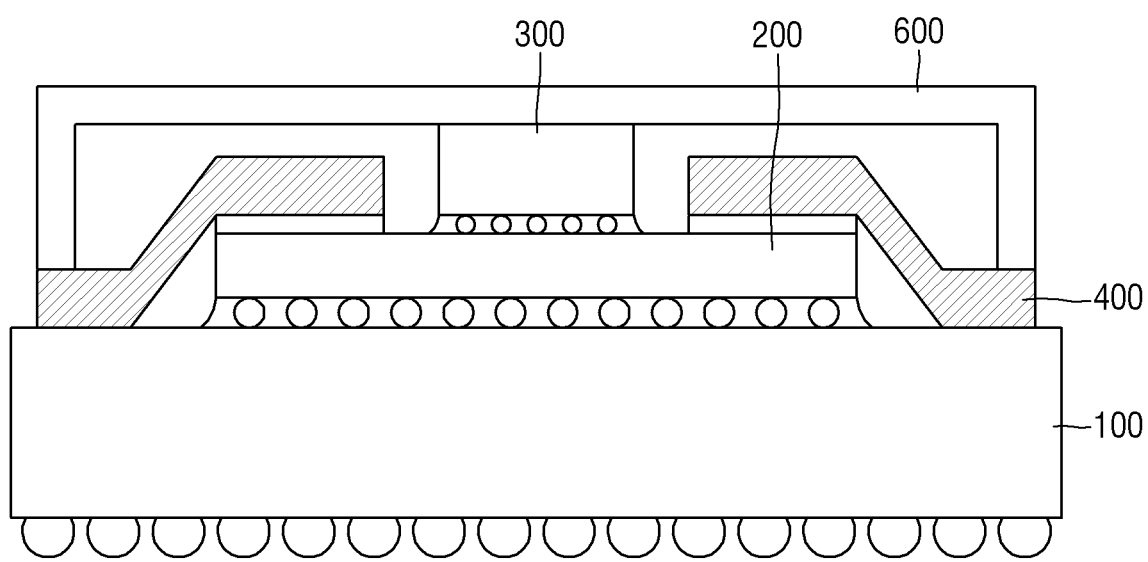
FIG. 16 is an exemplary cross-sectional view illustrating a semiconductor package according to some embodiments.

FIG. 16 is an exemplary cross-sectional view illustrating a semiconductor package according to some embodiments. For convenience of explanation, repeated or similar contents will be omitted or briefly described.

Referring to FIG. 16, the semiconductor package according to some embodiments may further include a heat sink 600. The heat sink 600 may extend from one side to the other, e.g., to the opposite side, of the stiffener 400 on the first substrate 100. The heat sink 600 may be in contact with the first semiconductor chip 300. As described above, the second height H2 of the uppermost surface 400u of the stiffener 400 (e.g., above a top surface of the first substrate 100) may be lower than the first height H1 of the upper surface 300u of the first semiconductor chip 300 (e.g., above the top surface of the first substrate 100). Therefore, an interference may not occur between the stiffener 400 and the heat sink 600. For example, there is a gap between the uppermost surface 400u of the stiffener 400 and a lower surface of the heat sink 600 for the stiffener 400 and the heat sink 600 to be space apart from each other.

In concluding the detailed description, those skilled in the art will appreciate that many variations and modifications may be made to the preferred embodiments without substantially departing from the principles of the present inventive concept. Therefore, the disclosed preferred embodiments of the inventive concept are used in a generic and descriptive sense only and not for purposes of limitation.

The embodiments of the present inventive concept have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the present inventive concept.

What is claimed is:

1. A semiconductor package comprising:
   a first substrate comprising a first region and a second region surrounding a periphery of the first region;
   a second substrate disposed on the first region, the second substrate comprising a third region and a fourth region surrounding a periphery of the third region;
   a first semiconductor chip disposed on the third region;
   a second semiconductor chip disposed on the third region, the second semiconductor chip spaced apart from the first semiconductor chip in a first direction;
   a third semiconductor chip disposed on the third region, the third semiconductor chip spaced apart from the first semiconductor chip in the first direction, the third semiconductor chip spaced apart from the second semiconductor chip in a second direction; and
   a stiffener extending along the second region,
   wherein the stiffener further extends from an upper surface of the first substrate to an upper surface of the second substrate, and
   the stiffener further extends between the second semiconductor chip and the third semiconductor chip on the second substrate.

2. The semiconductor package of claim 1, further comprising:
   a first air gap between the stiffener and the first semiconductor chip;
   a second air gap between the stiffener and the second semiconductor chip; and
   a third air gap between the stiffener and the third semiconductor chip.

3. The semiconductor package of claim 1, further comprising:
   a fourth semiconductor chip disposed on the third region, the fourth semiconductor chip spaced apart from the first semiconductor chip in a third direction opposite to the first direction; and
   a fifth semiconductor chip disposed on the third region, the fifth semiconductor chip spaced apart from the first semiconductor chip in the third direction, the fifth semiconductor chip spaced apart from the fourth semiconductor chip in the second direction,
   wherein the stiffener further extends between the fourth semiconductor chip and the fifth semiconductor chip on the second substrate.

4. The semiconductor package of claim 3, further comprising:
   a fourth air gap between the stiffener and the fourth semiconductor chip; and
   a fifth air gap between the stiffener and the fifth semiconductor chip.

5. The semiconductor package of claim 1,
   wherein the stiffener further extends along the second direction on the second substrate and does not contact any of the first semiconductor chip, the second semiconductor chip or the third semiconductor chip.

6. The semiconductor package of claim 5, wherein:
   the first semiconductor chip comprises a first side extending in the first direction, and a second side extending in the first direction and opposing the first side in the second direction, and
   the stiffener is spaced apart from the first side, and the second side in the second direction.

7. The semiconductor package of claim 1, wherein:
the first semiconductor chip comprises a first side extending in the first direction, and a second side extending in the second direction,
the first substrate comprises a third side extending in a third direction, and a fourth side extending in a fourth direction, and
the first direction to the fourth direction are different from each other in a plan view.

8. The semiconductor package of claim 7,
wherein the second substrate comprises a fifth side extending in the first direction, and a sixth side extending in the second direction.

9. The semiconductor package of claim 1,
wherein a first height from an upper surface of the first substrate to an upper surface of the first semiconductor chip is greater than a second height from the upper surface of the first substrate to an uppermost surface of the stiffener.

10. The semiconductor package of claim 9, further comprising:
a heat sink extending from one side to the other of the stiffener on the first substrate, and contacting the first semiconductor chip.

11. The semiconductor package of claim 1, further comprising:
an interface film between the second substrate and the stiffener,
wherein the interface film comprises a combination of a first material having a thermal conductivity of 10 W/(m·K) or more and silicone resin.

12. The semiconductor package of claim 11, wherein the first material comprises at least one of $Al_2O_3$, Al and ZnO.

13. A semiconductor package comprising:
a first substrate;
a second substrate disposed on an upper surface of the first substrate;
a first semiconductor chip disposed on an upper surface of the second substrate;
a second semiconductor chip disposed on the upper surface of the second substrate, the second semiconductor chip spaced apart from the first semiconductor chip in a first direction;
a third semiconductor chip disposed on the upper surface of the second substrate, the third semiconductor chip spaced apart from the first semiconductor chip in the first direction and spaced apart from the second semiconductor chip in a second direction;
a stiffener including a first portion disposed on the upper surface of the first substrate, a second portion disposed on the upper surface of the second substrate between the second semiconductor chip and the third semiconductor chip, and a third portion connecting the first portion and the second portion, the stiffener not contacting any of the first semiconductor chip, the second semiconductor chip or the third semiconductor chip; and
a first air gap defined by the upper surface of the first substrate, the second portion of the stiffener, and a sidewall of the second substrate.

14. The semiconductor package of claim 13, wherein the stiffener comprises a closed loop shape from a top-down view.

15. The semiconductor package of claim 13, further comprising:
a fourth semiconductor chip disposed on the upper surface of the second substrate; and a fifth semiconductor chip disposed on the upper surface of the second substrate, the fifth semiconductor chip spaced apart from the fourth semiconductor chip in the second direction,
wherein:
the first semiconductor chip is spaced apart from the fourth semiconductor chip and the fifth semiconductor chip in the first direction,
the second portion of the stiffener is further disposed on the upper surface of the second substrate between the fourth semiconductor chip and the fifth semiconductor chip,
the third portion of the stiffener further connects the first portion and the second portion, and
the stiffener does not contact any of the fourth semiconductor chip or the fifth semiconductor chip.

16. The semiconductor package of claim 15, wherein:
the first semiconductor chip comprises a first side extending in the first direction, and a second side extending in the first direction and opposing the first side in the second direction, and
the second portion of the stiffener is further disposed on the upper surface of the second substrate spaced apart from the first side in the first direction.

17. The semiconductor package of claim 13, wherein:
the first semiconductor chip comprises a first side extending in the first direction, and a second side extending in the second direction,
the first substrate comprises a third side extending in a third direction, and a fourth side extending in a fourth direction, and
the first direction to the fourth direction are different from each other in a plan view.

18. The semiconductor package of claim 17,
wherein the second substrate comprises a fifth side extending in the first direction, and a sixth side extending in the second direction.

19. The semiconductor package of claim 13,
wherein a first height from an upper surface of the first substrate to an upper surface of the first semiconductor chip is greater than a second height from the upper surface of the first substrate to an uppermost surface of the stiffener.

20. A semiconductor package comprising:
a first substrate comprising a first region and a second region surrounding a periphery of the first region;
a second substrate disposed on the first region, the second substrate comprising a third region and a fourth region surrounding a periphery of the third region;
a first semiconductor chip disposed on the third region;
a second semiconductor chip disposed on the third region, the second semiconductor chip spaced apart from the first semiconductor chip in a first direction;
a third semiconductor chip disposed on the third region, the third semiconductor chip spaced apart from the first semiconductor chip in the first direction, the third semiconductor chip spaced apart from the second semiconductor chip in a second direction;
a fourth semiconductor chip disposed on the third region, the fourth semiconductor chip spaced apart from the first semiconductor chip in a third direction opposite to the first direction; and
a fifth semiconductor chip disposed on the third region, the fifth semiconductor chip spaced apart from the first semiconductor chip in the third direction, the fifth semiconductor chip spaced apart from the fourth semiconductor chip in the second direction;

a stiffener extending along the second region; and a heat sink extending from one side to the other of the stiffener on the first substrate, wherein:

the stiffener further extends from an upper surface of the first substrate to an upper surface of the second substrate, the stiffener further extends between the second semiconductor chip and the third semiconductor chip, and the fourth semiconductor chip and the fifth semiconductor chip, on the second substrate, and the heat sink contacts the first semiconductor chip and does not contact the stiffener.

\* \* \* \* \*